(12) United States Patent
Okada

(10) Patent No.: US 6,754,246 B2
(45) Date of Patent: Jun. 22, 2004

(54) LASER LIGHT SOURCE APPARATUS

(75) Inventor: Naotada Okada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/138,562

(22) Filed: May 6, 2002

(65) Prior Publication Data

US 2002/0171941 A1 Nov. 21, 2002

(30) Foreign Application Priority Data

May 7, 2001 (JP) ......................................... 2001-135752

(51) Int. Cl.⁷ ................................................ H01S 5/00
(52) U.S. Cl. ........................... 372/50; 372/92; 372/108
(58) Field of Search ............................ 372/50, 92, 108

(56) References Cited

U.S. PATENT DOCUMENTS 5,058,981 A * 10/1991 Umegaki et al. ........... 359/328
5,369,661 A * 11/1994 Yamaguchi et al. .......... 372/69
6,229,831 B1 * 5/2001 Nightingale et al. ......... 372/36
6,400,513 B1 * 6/2002 Southwell .................. 359/641

FOREIGN PATENT DOCUMENTS

| JP | 8-307017 | 11/1996 |
| JP | 2000-98191 | 4/2000 |

\* cited by examiner

*Primary Examiner*—Paul Ip
*Assistant Examiner*—Leith A Al-Nazer
(74) *Attorney, Agent, or Firm*—Finnegan, Henderson, Farabow, Garrett & Dunner, L.L.P.

(57) ABSTRACT

A semiconductor laser light source has a semiconductor laser array having a plurality of light-emitting portions which emit semiconductor laser beams, a collimator lens which collimates each semiconductor laser beam emitted from each light-emitting portion of the semiconductor laser array, and a wedge prism which deflects the optical axis of each semiconductor laser beam transmitted through the collimator lens to be parallel to each other.

11 Claims, 6 Drawing Sheets

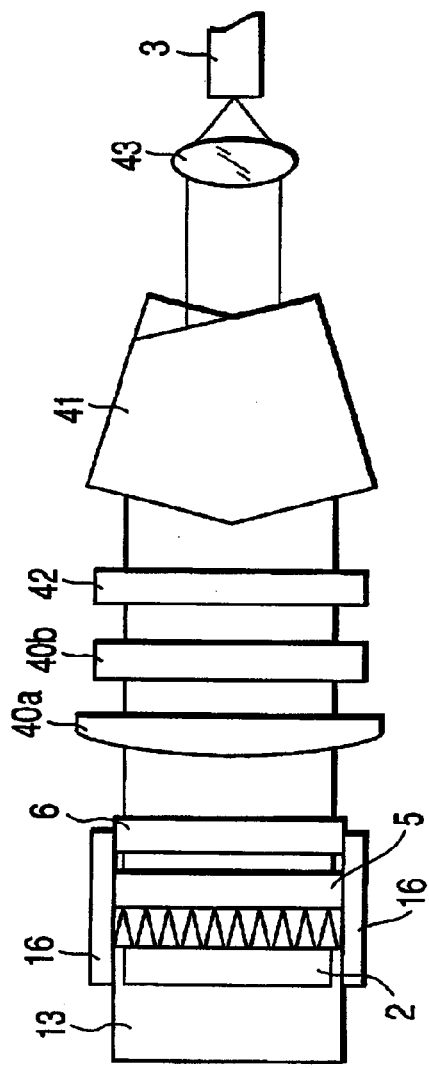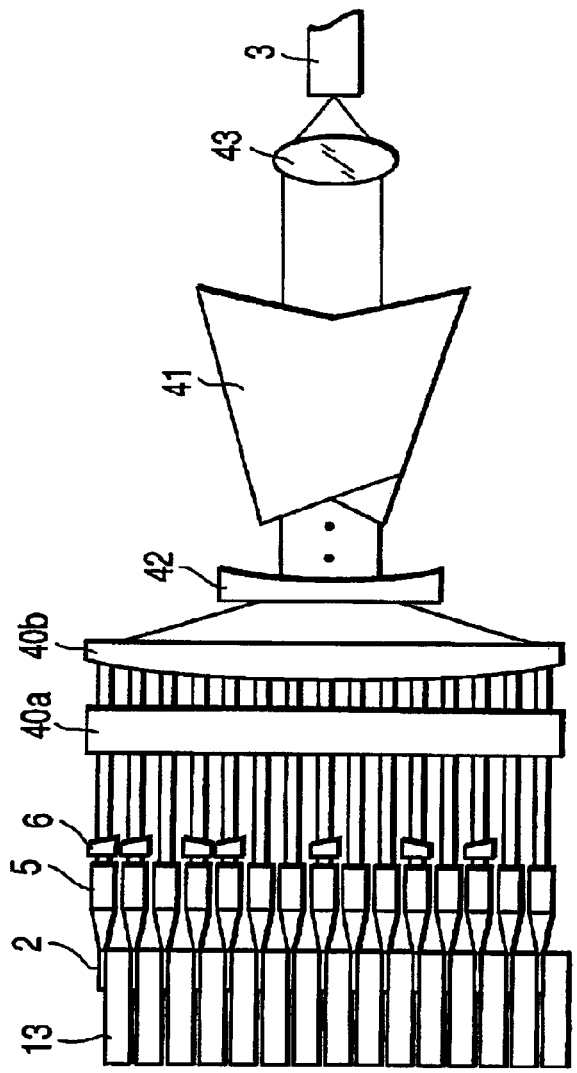
F I G. 12A
F I G. 12B

LASER LIGHT SOURCE APPARATUS

CROSS-REFERENCE TO RELATED APPLICATIONS

This application is based upon and claims the benefit of priority from the prior Japanese Patent Application No. 2001-135752, filed May 7, 2001, the entire contents of which are incorporated herein by reference.

BACKGROUND OF THE INVENTION

1. Field of the Invention

The present invention relates to a laser light source apparatus using a semiconductor laser array.

2. Description of the Related Art

A semiconductor laser has a high electro-optic conversion efficiency and luminance equal to that of a YAG laser. The semiconductor laser has ideal characteristics as a solid laser.

A direction parallel to the active layer of a semiconductor laser is defined as an x direction, and a direction perpendicular to the active layer is defined as a y direction. The beam divergence angle of a semiconductor laser beam emitted from a semiconductor laser differs between the x direction and the y direction because the light-emitting portion serves as, e.g., a 1-$\mu$m×100-$\mu$m surface illuminant. Hence, when the semiconductor laser is applied to a normal optical system that is designed to be symmetrical with respect to the laser optical axis, it is difficult to focus the semiconductor laser beam to a small region.

Especially, a semiconductor laser array has a plurality of light-emitting portions that emit a semiconductor laser beam. In the semiconductor laser array, each light-emitting portion has a size of 1 $\mu$m×100 $\mu$m. A number of emitters are arrayed in the x direction at pitches as small as 0.2 to 0.5 mm. For this reason, it is more difficult to focus the semiconductor laser beam emitted from the semiconductor laser array to a small region.

An optical system that focuses a semiconductor laser beam emitted from a semiconductor laser array is described in, e.g., Jpn. Pat. Appln. KOKAI Publication No. 8-307017. According to the description in this prior art, a micro-collimator lens array is arranged in correspondence with each light-emitting portion of a semiconductor laser array. The micro-collimator lens array is formed to have a periodical structure.

Another optical system which focuses a semiconductor laser beam is described in, e.g., Jpn. Pat. Appln. KOKAI Publication No. 2000-98191. This prior art describes an optical system which efficiently makes a semiconductor laser beam emitted from a two-dimensional semiconductor laser array incident on an optical fiber and outputs the laser beam. That is, the optical system comprises a collimator lens array and a condenser lens array. The collimator lens array collimates the semiconductor laser beam in at least one of the vertical and horizontal directions of a plurality of light-emitting portions that are two-dimensionally arrayed. The condenser lens array focuses the semiconductor laser beam in both of the vertical and horizontal directions of the plurality of light-emitting portions that are two-dimensionally arrayed.

To obtain a large output, a plurality of semiconductor laser arrays are stacked in the y direction. However, the above prior arts disclose no optical system which efficiently focuses a semiconductor laser beam emitted from each of the plurality of stacked semiconductor laser arrays at all.

BRIEF SUMMARY OF THE INVENTION

It is an object of the present invention to provide a laser light source apparatus capable of efficiently focusing each semiconductor laser beam emitted from a semiconductor laser array.

A laser light source apparatus according to a main aspect of the present invention comprises a semiconductor laser light source having a plurality of light-emitting portions which emit semiconductor laser beams, a collimator section which collimates the semiconductor laser beams emitted from the light-emitting portions in the semiconductor laser light source, and a laser beam deflecting section which deflects optical axes of the semiconductor laser beams, which are collimated by the collimator section, to be parallel to each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 12A is a plan view of an optical system using collimator lenses and 3-division prism; and FIG. 12B is a side view of the optical system using the collimator lenses and 3-division prism.

DETAILED DESCRIPTION OF THE INVENTION

An embodiment of the present invention will be described below with reference to the accompanying drawing.

Figure 1A:
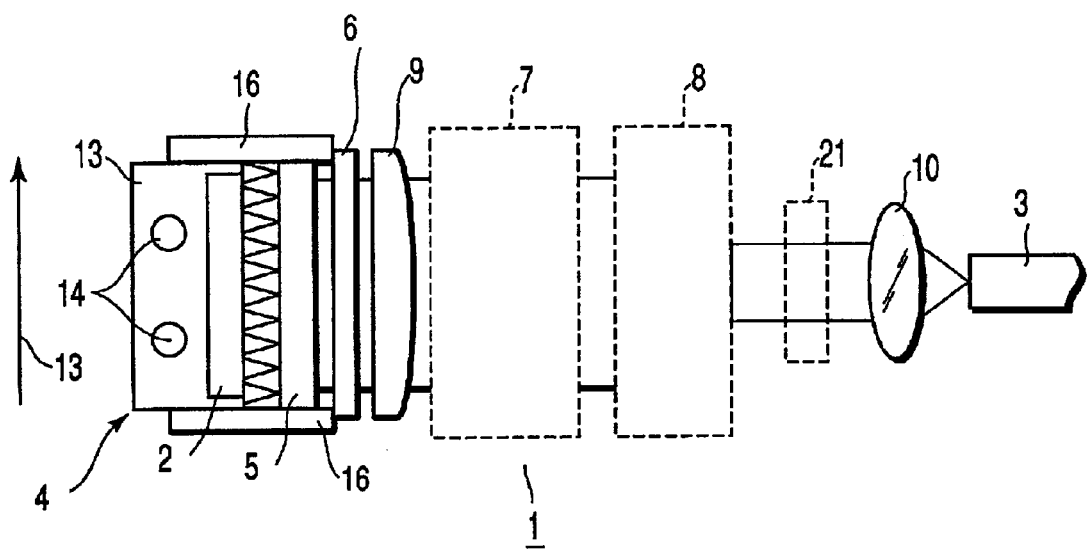
FIG. 1A is a plan view of a laser light source apparatus according to an embodiment of the present invention.
Figure 1B:
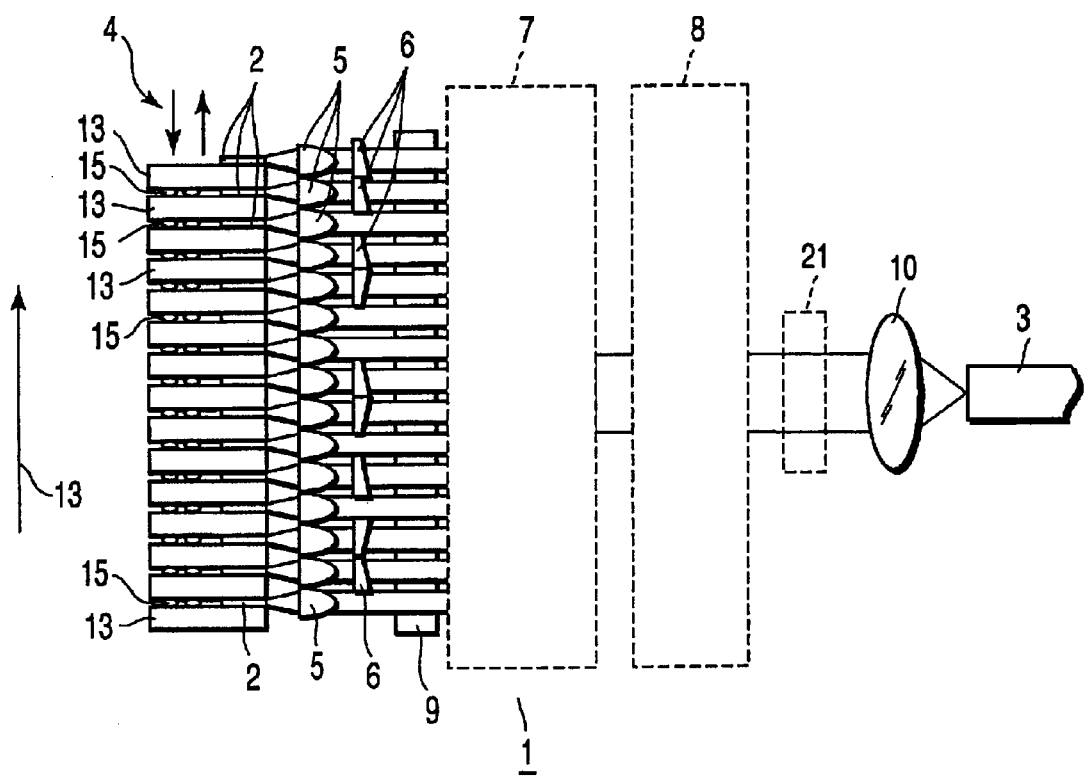
FIG. 1B is a side view of the laser light source apparatus according to the embodiment of the present invention.

FIG. 1A is a plan view of a laser light source apparatus 1. FIG. 1B is a side view of the laser light source apparatus. The laser light source apparatus 1 is applied to couple a semiconductor laser beam emitted from a semiconductor laser array 2 to an optical fiber 3.

The laser apparatus 1 comprises a semiconductor laser stack 4 which emits a laser beam, collimator lenses 5, wedge prisms 6, an anamorphic prism pair 7, a 6-division prism 8, a cylindrical lens 9, and a condenser lens 10.

The semiconductor laser stack 4 has the semiconductor laser arrays 2 stacked at multiple stages.

Each collimator lens 5 collimates a semiconductor laser beam emitted from a corresponding semiconductor laser array 2. Each collimator lens 5 is arranged to oppose a corresponding semiconductor laser array 2.

Each wedge prism 6 is arranged to oppose a predetermined collimator lens 5.

The anamorphic prism pair 7 corrects the beam divergence of each semiconductor laser beam.

The 6-division prism 8 shapes each semiconductor laser beam that has undergone divergence correction.

The cylindrical lens 9 corrects the astigmatic difference of the semiconductor laser beam.

The condenser lens 10 focuses the laser beam to the end facet of the optical fiber 3.

Each component will be described below.

Figure 2:
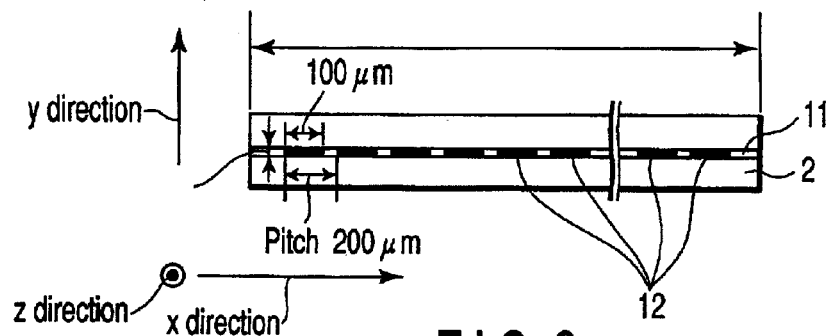
FIG. 2 is a view showing the arrangement of a semiconductor laser array.

FIG. 2 is a view showing the arrangement of the semiconductor laser array 2. In the semiconductor laser array 2, a plurality of light-emitting portions 12 are arranged in the formation direction of an active layer 11. Each of the plurality of light-emitting portions 12 emits a semiconductor laser beam. Each light-emitting portion 12 has a width of about 100 μm and a height of about 1 μm. A total of 49 light-emitting portions 12 are arranged at a pitch of, e.g., 200 μm.

The oscillation wavelength of the semiconductor laser beam emitted from each semiconductor laser array 2 is about 808 nm. When represented by a numerical aperture NA, the beam divergence of the semiconductor laser beam is about 0.06 in a direction parallel to the active layer 11 and about 0.45 in a direction perpendicular to the active layer 11.

The output of one semiconductor laser array 2 is about 50 W.

As shown in FIG. 2, a direction parallel to the active layer 11 is defined as an x direction, a direction perpendicular to the active layer 11 is defined as a y direction, and a direction perpendicular to both the x and y directions is defined as a z direction for the descriptive convenience.

For the semiconductor laser stack 4, 15 semiconductor laser arrays 2 are stacked in the y direction at a pitch of, e.g., 1.75 mm. Since the output of one semiconductor laser array 2 is 50 W, the output of the entire semiconductor laser stack 4 is about 750 W.

A heat sink 13 is bonded to each semiconductor laser array 2 for cooling. Each heat sink 13 is arranged on the rear surface side of a corresponding semiconductor laser array 2. Each heat sink 13 has through holes 14, as shown in FIG. 1A. A cooling medium from a circulation device (not shown) circulates through the through holes 14.

An O-ring 15 is arranged around each through hole 14 of the heat sinks 13. Each heat sink 13 is clamped by the heat sinks 13 on the upper and lower sides and a clamp means (not shown) through the O-rings 15. This prevents any leakage of the cooling medium. The semiconductor laser arrays 2 and heat sinks 13 are integrally stacked.

Each collimator lens 5 is arranged to oppose the active layer 11 of a corresponding semiconductor laser array 2. The collimator lens 5 is a cylindrical lens. The collimator lens 5 collimates the y-direction beam divergence of a semiconductor laser beam to 0.5 mrad, approximately.

The collimator lens 5 has a length (x direction) of 12 mm, a width (y direction) of 1.7 mm, a thickness (z direction) of 2 mm, and an effective focal length of 2 mm. The collimator lens 5 is formed from an optical glass member with plane and convex surfaces. The collimator lens 5 is arranged such that its laser incident surface opposing the active layer 11 becomes a plane surface 5a, and its convex surface from which the semiconductor laser beam emerges becomes a cylindrical aspherical surface 5b.

The cylindrical aspherical surface 5b is polished by an electron beam such that its wavefront aberration becomes λ/4 or less (λ is the wavelength of the semiconductor laser beam). For the focusing performance, the wavefront aberration preferably falls within λ/4.

Spacers 16 are fixed on the side surfaces of each heat sink 13, i.e., at the two ends of each semiconductor laser array 2. The collimator lenses 5 are connected and held by the side surfaces of the spacers 16 and adhesive, as shown in FIG. 1A. For the illustrative convenience, no spacers 16 are illustrated in FIG. 1B.

Figure 4:
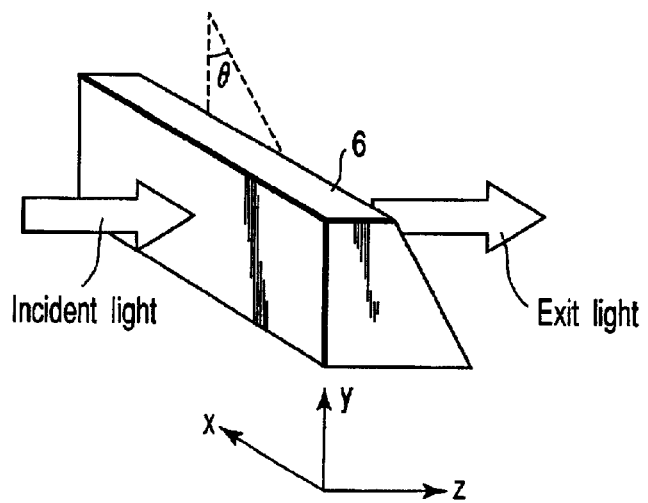
FIG. 4 is a view of the outer appearance of a wedge prism.

FIG. 4 is a view of the outer appearance of the wedge prism 6.

Each collimator lens 5 has a shift in its attachment position. Hence, the traveling directions (optical axes) of semiconductor laser beams transmitted through the collimator lenses 5 are not parallel to each other. This results in a loss in focusing performance of the semiconductor laser beam.

Hence, the collimator lenses 5 deflect the semiconductor laser beams in the y direction such that they become parallel to each other. To deflect the semiconductor laser beams, each wedge prism 6 is arranged to oppose a corresponding collimator lens 5.

The wedge prism 6 has a rectangular columnar shape with a length (x direction) of 14 mm, a width (y direction) of 1.7 mm, a thickness (z direction) of about 1 mm. The wedge prism 6 is an optical element made of synthetic silica glass and having a trapezoidal section in the y-z plane.

The wedge prism 6 has a wedge angle θ made by an incident surface on which the semiconductor laser beam becomes incident and an exit surface from which the semiconductor laser beam emerges. A wedge prism 6 having an appropriate wedge angle θ is selected in accordance with the shift amount with respect to the optical axes of the parallel lasers. The wedge angle θ is about 10 mrad at maximum. The wedge prism 6 is held by bonding the end portion of its incident surface to the end faces of the spacers 16, as shown in FIG. 1A.

The arrangement of the wedge prism 6 will be described next.

The semiconductor laser has large beam divergence in a direction (y direction) perpendicular to the active layer 11. Generally, the collimator lens 5 is arranged to oppose the active layer 11 to collimate the semiconductor laser beam.

However, the collimator lens 5 has a symmetrical shape with respect to the central axis. To appropriately collimate the semiconductor laser beam, it must become incident on the central axis of the collimator lens 5. The collimator lens 5 is arranged such that the semiconductor laser beam becomes incident on the central axis.

If the attachment position of the collimator lens 5 shifts even slightly, the traveling direction of the semiconductor laser beam shifts, resulting in significant error. This adversely affects the focusing performance of the semiconductor laser beam.

Figure 3:
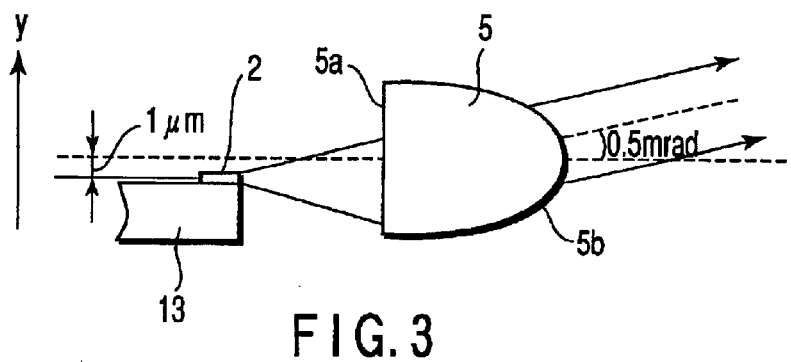
FIG. 3 is a view showing a state wherein a collimator lens is attached to the semiconductor laser array with a shift.

FIG. 3 shows an example wherein the collimator lens 5 is attached to the semiconductor laser array 2 with a significant shift. When the position of the collimator lens 5 shifts by 1 $\mu$m in, e.g., the y direction, the traveling direction (optical axis) of the semiconductor laser beam has a deviation of about 0.5 mrad.

To prevent this, in this embodiment, each collimator lens 5 is attached to a corresponding semiconductor laser array 2 in the following way.

Figure 5A:
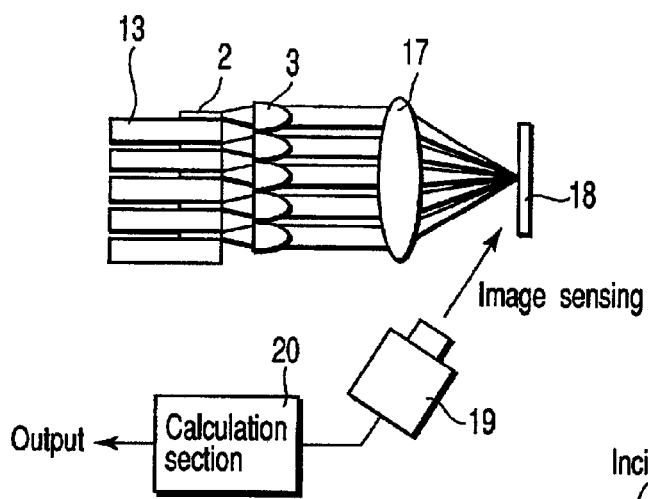
FIG. 5A is a view showing the arrangement of an apparatus for attaching the collimator lenses.

FIG. 5A is a view showing the arrangement of an apparatus for attaching the collimator lenses 5. This apparatus has a condenser lens 17, screen 18, CCD camera 19, and calculation section 20.

The condenser lens 17 focuses the semiconductor laser beams emitted from the semiconductor laser arrays 2 in the y direction.

The screen 18 is arranged at the imaging position of the condenser lens 17. The image of each semiconductor laser beam, which is formed by the condenser lens 17, is projected to the screen 18.

The CCD camera 19 senses each semiconductor laser beam image projected to the screen 18.

The calculation section 20 calculates the shift amount of each semiconductor laser beam image by image recognition on the basis of image sensing data obtained by image sensing by the CCD camera 19.

In FIG. 5A, five semiconductor laser arrays 2 are stacked, for the illustrative convenience. However, the number of the semiconductor laser arrays 2 stacked is not particularly limited.

While keeping the semiconductor laser beams emitted, the collimator lenses 5 are attached.

Figure 5B:
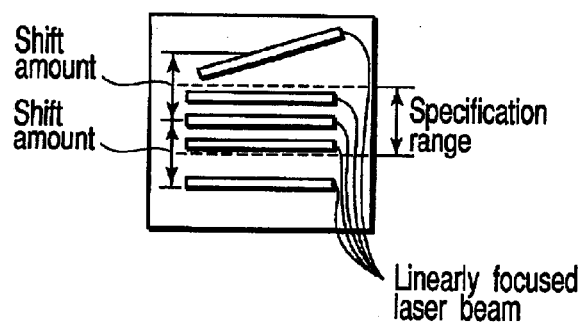
FIG. 5B is a schematic view of an image sensed by a CCD camera.

FIG. 5B is a schematic view of an image sensed by the CCD camera 19. The condenser lens 17 focuses each semiconductor laser beam only in the y direction. Each semiconductor laser beam is focused into a linear shape. Hence, when, e.g., five semiconductor laser arrays 2 are stacked, five lines are formed.

If the lines match, the semiconductor laser beams can be regarded to be parallel to each other. In addition, even if the lines do not match, they can be regarded to satisfy the specifications as long as they fall within a predetermined range. If the lines are in either state, the product can be immediately delivered.

Hence, the operator bonds, with adhesive, the end face of each collimator lens 5 to the spacers 16 while observing the shift amount of the semiconductor laser beam image, which is output from the calculation section 20, such that the shift amount falls within the specifications.

After the adhesive is cured, semiconductor laser beams are emitted from the semiconductor laser arrays 2 again. It is checked whether the shift amount of each semiconductor laser beam image falls within the specifications.

Shrinkage by the cured adhesive, the influence of bubbles in the adhesive, or the influence of gravity causes a shift in traveling direction of each semiconductor laser beam, resulting in adverse influence on the focusing performance of the semiconductor laser beam. In addition, a slight attachment position shift of a collimator lens 5 shifts the traveling direction of the semiconductor laser beam, resulting in adverse influence on the focusing performance of the semiconductor laser beam.

Hence, even when the shift amount of a semiconductor laser beam image falls within the specifications at the time of bonding the collimator lens 5 and spacers 16, the shift amount sometimes falls outside the specifications after that. If the shift amount of a semiconductor laser beam image falls outside the specifications, the wedge prism 6 must be attached in correspondence with the semiconductor laser array 2.

First, the wedge prism 6 having an appropriate wedge angle is selected on the basis of the measured shift amount of the semiconductor laser beam image. The larger the shift amount of the semiconductor laser beam image becomes, the larger the deflection amount of the semiconductor laser beam must be. Hence, the larger the shift amount becomes, the larger the wedge angle of the selected wedge prism 6 becomes.

Next, the wedge prism 6 is attached. As shown in FIG. 1A, the end portion of the incident surface of the wedge prism 6 is bonded to the end face of the heat sink 13 are bonded with adhesive.

Figure 6:
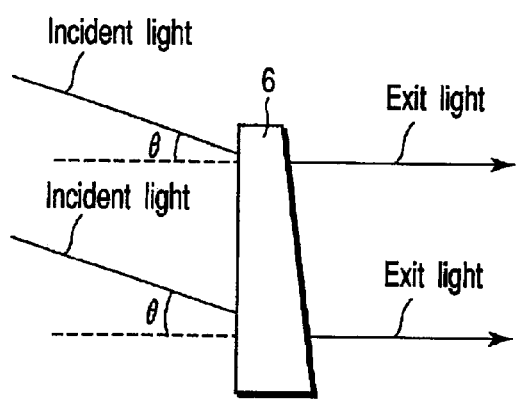
FIG. 6 is a view showing deflection of a semiconductor laser beam by the wedge prism.

As shown in FIG. 6, the incident surface and exit surface of the wedge prism 6 are plane surfaces. For this reason, even when the wedge prism 6 is bonded with a shift, the deflection angle does not change.

As compared to attachment of the collimator lens 5, the wedge prism 6 requires no attachment accuracy.

In this way, the wedge prism 6 is attached to the semiconductor laser array 2 that falls outside the specifications. Hence, semiconductor laser beams emitted from the semiconductor laser arrays 2 have improved parallelism. As a result, the focusing performance of the semiconductor laser beam is improved.

Hence, the laser light source apparatus 1 having a high quality can be manufactured. In addition, even for a rotational shift about the x-axis, the present invention is more advantageous than the prior art because the deflection angle by the wedge prism 6 rarely changes.

With the laser light source apparatus 1, a semiconductor laser beam having a beam section (x direction×y direction) of about 10 mm×about 26 mm and a half-angle beam divergence (x direction×y direction) of about 60 mrad×0.5 mrad can be obtained.

The sectional size is based on the fact that 49 light-emitting portions 12 are arrayed at a pitch of 0.2 mm, and 15 stages of semiconductor laser arrays 2 are stacked at a pitch of 1.75 mm.

The laser light source apparatus 1 can be manufactured as a product. In this embodiment, an optical system which focuses a semiconductor laser beam to a small region such as the end face of the optical fiber 3 will be described below.

This optical system corrects the beam divergence, beam shape, and astigmatic difference. With the beam divergence correction, the beam divergence of the semiconductor laser beam in the x direction is made to almost equal that in the y direction.

With the beam shape correction, an almost square beam shape with almost equal lengths in the x and y direction s is formed.

Astigmatic difference is a shift in focusing position in two directions (e.g., x and y directions) perpendicular to the optical axis of the focused semiconductor laser beam. To correct astigmatic difference, the shift in focusing position in two directions (e.g., x and y directions) perpendicular to the optical axis is corrected.

Figure 7:
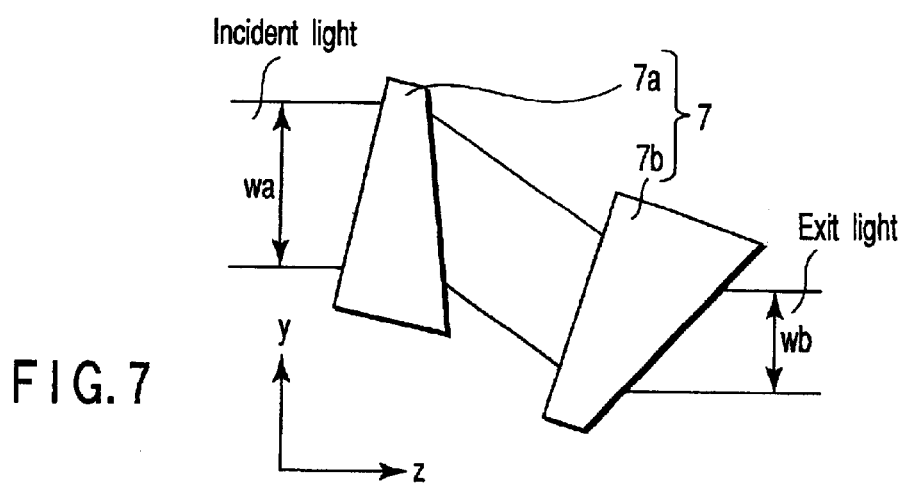
FIG. 7 is a view showing a detailed method of correcting beam divergence.

FIG. 7 is a view showing a detailed method of correcting beam divergence. The anamorphic prism pair 7 is formed from a set of anamorphic prisms 7a and 7b. The anamorphic prism pair 7 reduces the beam width in the y direction. Referring to FIG. 7, a beam width Wa of incident light is reduced to exit light with a beam width Wb.

More specifically, the anamorphic prism pair 7 reduces the beam width to about 1/100 of about 26 mm, i.e., about 0.3 mm.

The beam width and beam divergence are almost inversely proportional to each other. Hence, the beam divergence in the y direction changes to about 100 times of 0.5 mrad, i.e., 50 mrad, which is almost equal to the beam divergence in the x direction (60 mrad).

Beam shape correction is done by the 6-division prism 8.

Figure 8A:
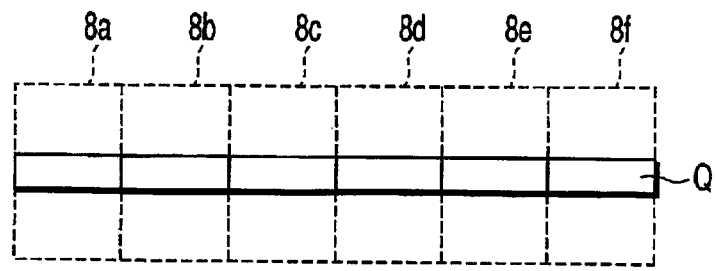
FIG. 8A is a view showing a beam shape before passing through a 6-division prism.
Figure 8B:
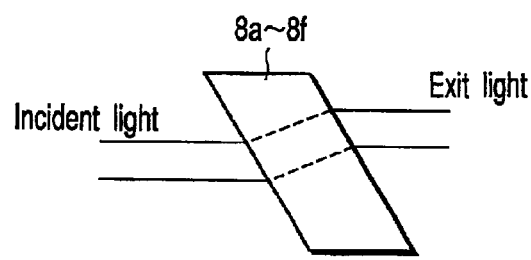
FIG. 8B is a view showing the function of a unit prism of the 6-division prism.
Figure 8C:
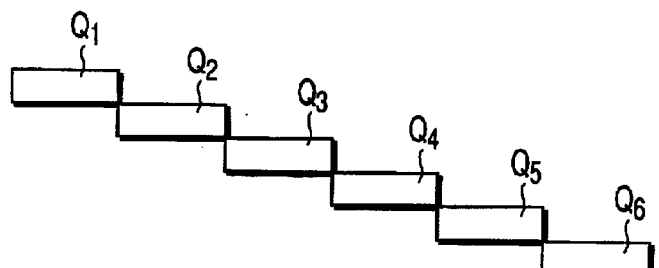
FIG. 8C is a view showing a beam shape during passing through the 6-division prism.
Figure 8D:
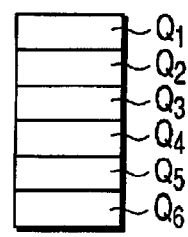
FIG. 8D is a view showing a beam shape after passing through the 6-division prism.

FIGS. 8A to 8D are views showing a change in shape of a beam transmitted through the 6-division prism 8. FIG. 8A shows a beam shape before passing through the 6-division prism 8. FIG. 8B shows the function of each of unit prisms 8a to 8f of the 6-division prism 8. FIG. 8C shows a beam shape during passing through the 6-division prism 8. FIG. 8D shows a beam shape after passing through the 6-division prism 8.

The unit prisms 8a to 8f shift the optical axis of incident light in the y direction, as shown in FIG. 8B. The amount of y-direction shift of the optical axis of incident light changes between the unit prisms 8a to 8f.

Hence, a linear semiconductor laser beam Q becomes incident on the 6-division prism 8, the semiconductor laser beam is split into six beams $Q_1$ to $Q_6$ having different optical axes, as shown in FIG. 8C.

Then, the 6-division prism 8 stacks the semiconductor laser beams $Q_1$ to $Q_6$ in the y direction, as shown in FIG. 8D.

With this function, the 6-division prism 8 can obtain an almost square beam section with a size of 1.7 mm×1.8 mm. At this time, the beam divergence is maintained at 60 mrad×50 mrad.

Astigmatic difference is corrected by a cylindrical lens 21. For the cylindrical lens 21, one surface is formed into a plane surface, and the other surface opposing the plane surface is formed into a convex shape having a radius of curvature in the x direction.

The semiconductor laser beam focused by the condenser lens 10 in the above way is focused to the core portion of the optical fiber 3. Hence, the semiconductor laser beam with the improved focusing performance can be focused to the core portion of the optical fiber 3.

On the other hand, when a plurality of laser light source apparatuses 1 of this embodiment are used, the semiconductor laser beam output can be made large by coupling a plurality of semiconductor laser beams from the laser light source apparatuses 1.

Figure 9:
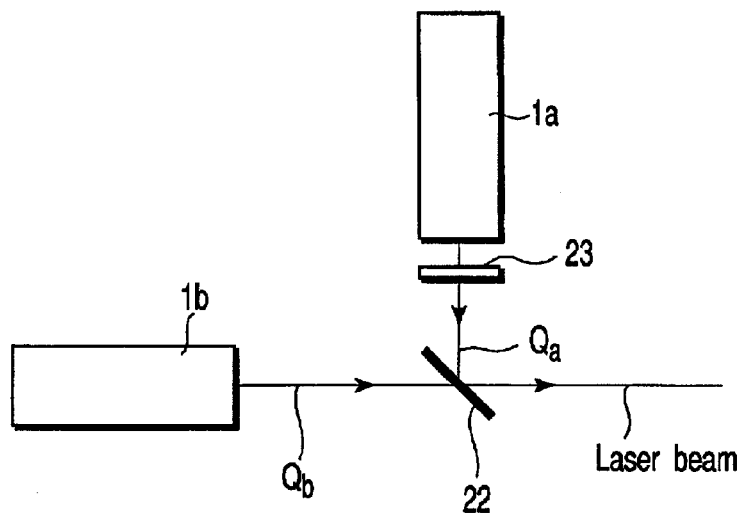
FIG. 9 is a view of an arrangement for coupling a plurality of semiconductor laser beams.

FIG. 9 is a view of an arrangement for coupling a plurality of, e.g., two semiconductor laser beams. Each of two laser light source apparatuses 1a and 1b has the same arrangement as that of the laser light source apparatus 1 shown in FIG. 1.

In this case, each of the laser light source apparatuses 1a and 1b has at least one of the 6-division prism 8 for correcting the beam shape and the cylindrical lens 21 for correcting astigmatic difference.

Semiconductor laser beams Qa and Qb output from the laser light source apparatuses 1a and 1b are coupled by a polarized beam coupling element 22.

A semiconductor laser is generally a linearly polarized beam. A λ/2 plate 23 is arranged on the optical path of a semiconductor laser beam output from one laser light source apparatus, e.g., the semiconductor laser beam Qa output from the laser light source apparatus 1a. With this arrangement, the deflection direction of the semiconductor laser beam Qa output from the laser light source apparatus 1a is changed by 90°.

As a consequence, the polarized beam coupling element 22 can couple the semiconductor laser beam Qa output from one laser light source apparatus 1a and the semiconductor laser beam Qb output from the other laser light source apparatus 1b.

With this coupling, an output of about 1 kW can be obtained by one wavelength. The coupled semiconductor laser beam can be focused by the condenser lens 10 having an effective focal length of, e.g., 5 mm and become incident on the optical fiber 3 having a core diameter of, e.g., 0.6 to 0.8 mm.

According to the above embodiment, the laser light source apparatus 1 has the semiconductor laser arrays 2 each having the plurality of light-emitting portions 12 each for emitting a semiconductor laser beam, the collimator lenses 5 each of which collimates the semiconductor laser beam emitted from each light-emitting portion 12 of the semiconductor laser arrays 2, and the wedge prisms 6 for deflecting the optical axes of the semiconductor laser beams transmitted through the collimator lenses 5 to be parallel to each other.

Hence, the semiconductor laser beams emitted from the semiconductor laser arrays 2 each having the plurality of light-emitting portions 12 can be focused to a small region at a high efficiency. For a welding, cutting, or removal process, a YAG laser or $CO_2$ laser with a high beam intensity is mainly used. The laser of the above embodiment can do a welding, cutting, or removal process in place of the YAG laser or $CO_2$ laser.

In the above embodiment, attention is paid to the fact that the semiconductor laser beams are not parallel due to, e.g., shrinkage of adhesive for each collimator lens 5. In the embodiment, the focusing performance of the semiconductor laser beams of the plurality of stacked semiconductor laser arrays 2 is improved not by correcting the shift in arrangement position of each collimator lens 5.

According to the above embodiment, the optical axes of the semiconductor laser beams are corrected to be parallel by the optical system on the output side of the collimator lenses 5.

Hence, in this embodiment, the focusing performance can easily and appropriately be improved. In addition, as an optical system for it, not a reflection optical system but an optical element which passes and deflects the semiconductor laser beams is used. For this reason, the focusing performance can be effectively improved.

In the above embodiment, the general-purpose wedge prism 6 is used as an optical element which deflects a semiconductor laser beam. The wedge prism 6 is normally used in an optical system to rotate a beam or arranged in a laser resonator to obtain appropriate resonance. Hence, the above embodiment is advantageous in terms of cost.

That is, if the collimator lens 5 has a positional shift of only 1 μm in, e.g., the y direction, the focusing efficiency largely degrades. In the above embodiment, however, the semiconductor laser beam is deflected using the wedge prism 6 whose wedge angle is made by the incident surface and exit surface.

Since the wedge prism 6 requires no attachment accuracy in the y direction, the focusing performance can easily be improved. Even when the wedge prism 6 is arranged with a shift in the y direction, the angle made by the incident surface and exit surface does not change. Hence, the wedge prism 6 requires no high attachment accuracy in the y direction.

Various changes and modifications can be made for the above embodiment.

For example, instead of the collimator lens 5 having a refracting power only in the y direction, various kinds of lenses can be used. The collimator lens 5 can be replaced with an optical element that forms a Fresnel lens. This optical element can collimate a semiconductor laser beam not only in the y direction but also in, e.g., the x direction.

Figure 10A:
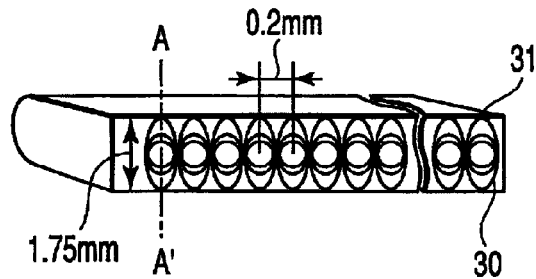
FIG. 10A is a view of the overall arrangement of an optical element.
Figure 10B:
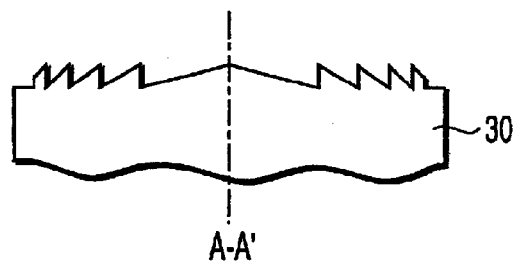
FIG. 10B is a sectional view of a Fresnel lens pattern.

FIGS. 10A and 10B are views of an optical element 31 having Fresnel lens patterns 30. FIG. 10A is a view showing the overall arrangement of the optical element 31. FIG. 10B is a sectional view of the Fresnel lens pattern 30.

In the optical element 31, the Fresnel lens pattern 30 is formed in correspondence with each light-emitting portion 12. With this structure, the optical element 31 can collimate a semiconductor laser beam not only in the y direction but also in the x direction.

The Fresnel lens patterns 30 must be formed at a small pitch of, e.g., 200 μm in correspondence with the light-emitting portions 12. For example, the pattern width of the Fresnel lens pattern 30 must be formed on the order of several μm or less.

Such a Fresnel lens pattern 30 is formed by a precision process such as RIE (Reactive Ion Etching) or atomic ray etching. In this method, when the Fresnel lens pattern 30 is processed such that it has different refracting powers in the x and y directions, one element suffices for two-dimensional collimating. Hence, this method is more advantageous in terms of beam shape and cost than the conventional optical system with two collimator lenses 5 combined.

To minimize the diffraction loss, a material having a refractive index of 1.8 or more is preferably used. More specifically, S-TIH53 (trade name) available from Ohara or SFL.57 (trade name) available from Schott is preferably used. More preferably, a crystal material such as ZnS or ZnSe having a refractive index above 2 is used.

Figure 11:
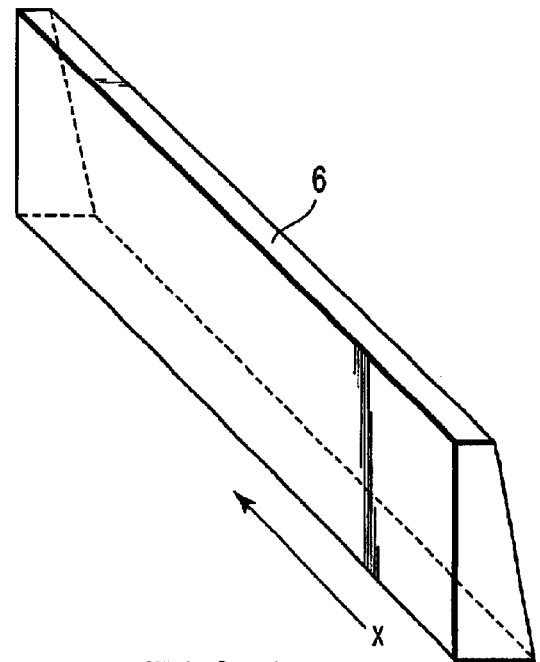
FIG. 11 is a view showing the outer appearance of a wedge prism with a continuously changing wedge angle.

The wedge angle θ of the wedge prism 6 may be continuously changed. FIG. 11 is a view showing the outer appearance of the wedge prism 6 with the continuously changing wedge angle θ. The wedge angle θ of the wedge prism 6 continuously changes in the x direction.

When the collimator lens 5 is not bonded symmetrically with respect to the heat sink 13 through the spacers 16, unlike FIG. 5B, a semiconductor laser beam focused into a linear beam becomes oblique. In this case, when the wedge prism 6 shown in FIG. 11 is arranged, the obliquely focused linear semiconductor laser beam is deflected in the x direction to be parallel to the remaining semiconductor laser beams. With this arrangement, more appropriate focusing can be attained.

In the above embodiment, the one-dimensional semiconductor laser arrays 2 are stacked in the vertical direction. However, the present invention is not limited to this. Instead, an integrated semiconductor laser array having the plurality of light-emitting portions 12 on a two-dimensional plane may be used.

Beam divergence correction by the anamorphic prism pair 7, beam shape correction by the 6-division prism 8, and astigmatic difference correction by the cylindrical lens 21 are appropriately used as needed. For example, to focus a semiconductor laser beam into a linear beam, astigmatic difference is corrected, and beam divergence correction is used to adjust the shape of the focused beam, as needed.

To correct beam divergence, the anamorphic prism pair 7 is used. Instead, a collimator lens or the like may be used as a beam expander.

For beam shaping, the 6-division prism 8 is used. However, any other optical element may be used. For beam shaping, for example, a polyhedral prism such as a 3-division prism or a mirror may be used.

FIGS. 12A and 12B are views of an optical system using a set of collimator lenses 40a and 40b and a 3-division prism 41. FIG. 12A is a plan view. FIG. 12B is a side view.

The set of collimator lenses 40a and 40b are arranged on the optical path of a semiconductor laser beam transmitted through the wedge prism 6. The set of collimator lenses 40a and 40b correct x- and y-direction divergence of the semiconductor laser beam.

A collimator lens 42 is inserted between the collimator lenses 40a and 40b and the 3-division prism 41. The collimator lens 42 corrects astigmatic difference with respect to the semiconductor laser beam.

The 3-division prism 41 shapes the semiconductor laser beam.

A condenser lens 43 is inserted between the 3-division prism 41 and the optical fiber 3.

With this arrangement, the x- and y-direction divergence of the semiconductor laser beam transmitted through the wedge prism 6 is corrected by the collimator lenses 40a and 40b.

Next, astigmatic difference correction by the collimator lens 42 is done for the semiconductor laser beam.

Next, the semiconductor laser beam is beam-shaped by the 3-division prism 41, focused by the condenser lens 43, and made incident on the optical fiber 3.

Such an optical system can also improve the focusing performance. Note that astigmatic difference correction may be done using a plurality of sets of collimator lenses.

In the above embodiment, the beam shape after beam shaping is almost square. However, the beam may be shaped into a circular shape almost symmetrical about, e.g., the optical axis.

As the polarized beam coupling element 22 used to couple the semiconductor laser beams from the two laser light source apparatuses 1a and 1b shown in FIG. 9, e.g., a dielectric multilayered film filter can be used. The dielectric multilayered film filter passes light having a wavelength of, e.g., 940 nm and reflects light having a wavelength of about 808 nm.

When this dielectric multilayered film filter is used, the semiconductor laser beam with a wavelength about 940 nm and the semiconductor laser beam with a wavelength about 808 nm, which are emitted from the plurality of laser light source apparatuses 1a, 1b, can be coupled.

In this case, to appropriately exhibit properties such as the reflectance or transmittance of the dielectric multilayered film filter, the incident angle is preferably 15° or less.

The wavelengths to be coupled are not limited to 808 nm and 940 nm. Arbitrary semiconductor laser oscillation wavelengths can be coupled. Three or more wavelengths may be coupled. For example, three semiconductor laser beams having wavelengths of 780 nm, 830 nm, and 940 nm can be coupled.

Wavelengths can be coupled not only by the dielectric multilayered film filter but also by a diffraction grating or triangular prism.

The semiconductor laser beam of the present invention can be used not only for focusing to the optical fiber 3 but also for various application purposes. For example, the semiconductor laser beam can be used for excitation to an excitation medium. The semiconductor laser beam can also be directly used for process without intervening the optical fiber 3.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser light source apparatus comprising:
   a semiconductor laser light source having a plurality of semiconductor laser arrays in which a plurality of light-emitting portions for emitting laser beams are arranged along a formation direction of an active layer of a semiconductor laser, the semiconductor laser light source being formed by stacking the plurality of semiconductor laser arrays in a direction perpendicular to the formation direction of the active layer;
   a plurality of cylindrical lenses provided on respective optical axes of the plurality of semiconductor laser arrays emitted from the light-emitting portions, for collimating respective semiconductor laser beams emitted from the plurality of semiconductor laser arrays in units of a semiconductor laser array; and
   at least one wedge prism arranged in an optical path of the semiconductor laser beam which has passed through at least one of the plurality of cylindrical lenses provided at a position shifted from the optical axes of the plurality of semiconductor laser beams, said wedge prism deflecting the optical axis of the semiconductor laser beam which has passed through said at least one of the plurality of cylindrical lenses to collimate it with another semiconductor laser beam;
   wherein the wedge prism has a wedge angle made by an incident surface on which the semiconductor laser beam becomes incident and an exit surface from which the semiconductor laser beam that has become incident emerges, and the wedge angle corresponds to the positional shift of the semiconductor laser beam with respect to the optical axes.

2. An apparatus according to claim 1, wherein
   each semiconductor laser array has a heat sink arranged on a rear surface side of the semiconductor laser array, for cooling the semiconductor laser array, and spacers fixed on side surfaces of the heat sink corresponding to two ends of each semiconductor laser array; and
   the plurality of cylindrical lenses are bonded to the semiconductor laser arrays or side surfaces of the spacers.

3. An apparatus according to claim 1, wherein the wedge angle of the wedge prism is formed to be an angle corresponding to a shift amount from the optical axes of the plurality of laser beams that are parallel to each other.

4. An apparatus according to claim 1, wherein the wedge angle of the wedge prism continuously changes in the same direction as a direction in which the plurality of light-emitting portions are arrayed.

5. A laser light source apparatus comprising:
   a semiconductor laser light source having a plurality of semiconductor laser arrays in which a plurality of light-emitting portions for emitting laser beams are arranged along a formation direction of an active layer of a semiconductor laser, the semiconductor laser light source being formed by stacking the plurality of semiconductor laser arrays in a direction perpendicular to the formation direction of the active layer;
   a plurality of Fresnel lens arrays provided on respective optical axes of the plurality of semiconductor laser arrays emitted from the light-emitting portions, for collimating respective semiconductor laser beams emitted from the plurality of semiconductor laser arrays in units of a semiconductor laser array, and
   at least one wedge prism arranged in an optical path of the semiconductor laser beam which has passed through at least one of the plurality of the Fresnel lens arrays provided at a position shifted from the optical axes of the plurality of semiconductor laser beams, said wedge prism deflecting the optical axis of the semiconductor laser beam which has passed through said at least one of the plurality of the Fresnel lens arrays to collimate it with another semiconductor laser beam;
   wherein the wedge prism has a wedge angle made by an incident surface on which the semiconductor laser beam becomes incident and an exit surface from which the semiconductor laser beam that has become incident emerges, and the wedge angle corresponds to the positional shift of the semiconductor laser beam with respect to the optical axes.

6. An apparatus according to claim 5, wherein
   each semiconductor laser array has a heat sink arranged on a rear surface side of the semiconductor laser array, for cooling the semiconductor laser array, and spacers fixed on side surfaces of the heat sink corresponding to two ends of each semiconductor laser array; and
   the plurality of cylindrical lenses are bonded to the semiconductor laser arrays or side surfaces of the spacers.

7. An apparatus according to claim 5, wherein the wedge angle of the wedge prism is formed to be an angle corresponding to a shift amount from the optical axes of the plurality of laser beams that are parallel to each other.

8. An apparatus according to claim 5, wherein the wedge angle of the wedge prism continuously changes in the same direction as the direction in which the plurality of light-emitting portions are arrayed.

9. An apparatus according to claim 5, wherein the Fresnel lens arrays refract the semiconductor laser beams emitted from the light-emitting portions in directions parallel to and perpendicular to the formation direction of the active layer.

10. A laser apparatus comprising:
    a semiconductor laser light source having a plurality of semiconductor laser arrays in which a plurality of light-emitting portions for emitting laser beams are arranged along a formation direction of an active layer of a semiconductor laser, the semiconductor laser light source being formed by stacking the plurality of semiconductor laser arrays in the direction perpendicular to the formation direction of the active layer;

a plurality of cylindrical lenses provided corresponding to the plurality of semiconductor laser arrays, for collimating the respective semiconductor laser beams emitted from the light-emitting portions in units of semiconductor laser array;

a wedge prism which deflects optical axes of the semiconductor laser beams which have passed through the cylindrical lenses, wherein the wedge prism is arranged on an optical path of a semiconductor laser beam which is shifted from optical axes of the semiconductor laser beams that are parallel to each other collimated by the cylindrical lenses, and the wedge prism has a wedge angle made by an incident surface on which the semiconductor laser beam becomes incident and an exit surface from which the semiconductor laser beam that has become incident emerges;

a pair of anamorphic prisms which correct beam divergence of each of the semiconductor laser beams passed through the cylindrical lenses and those deflected by the wedge prism;

a prism which shapes a beam of each semiconductor laser beam whose beam divergence has been corrected by the pair of anamorphic prisms; and a condenser lens which focuses each semiconductor laser beam whose beam has been shaped by the prism.

11. A laser apparatus comprising:

a semiconductor laser light source having a plurality of semiconductor laser arrays in which a plurality of light-emitting portions for emitting laser beams are arranged along a formation direction of an active layer of a semiconductor laser, the semiconductor laser light source being formed by stacking the plurality of semiconductor laser arrays in the direction perpendicular to the formation direction of the active layer;

a plurality of Fresnel lens arrays provided corresponding to the plurality of semiconductor laser arrays, for collimating the respective semiconductor laser beams emitted from the light-emitting portions in units of semiconductor laser array;

a wedge prism which deflects optical axes of the semiconductor laser beams which have passed through the Fresnel lens arrays, wherein the wedge prism is arranged on an optical path of a semiconductor laser beam which is shifted from optical axes of the semiconductor laser beams that are parallel to each other collimated by the Fresnel lens arrays, and the wedge prism has a wedge angle made by an incident surface on which the semiconductor laser beam becomes incident and an exit surface from which the semiconductor laser beam that has become incident emerges;

a pair of anamorphic prisms which correct beam divergence of each of the semiconductor laser beams passed through the Fresnel lens arrays and those deflected by the wedge prism;

a prism which shapes a beam of each semiconductor laser beam whose beam divergence has been corrected by the pair of anamorphic prisms; and a condenser lens which focuses each semiconductor laser beam whose beam has been shaped by the prism.

* * * * *